(12) United States Patent
Tsunoda et al.

(10) Patent No.: US 7,192,540 B2
(45) Date of Patent: Mar. 20, 2007

(54) LOW DIELECTRIC CONSTANT MATERIAL HAVING THERMAL RESISTANCE, INSULATION FILM BETWEEN SEMICONDUCTOR LAYERS USING THE SAME, AND SEMICONDUCTOR DEVICE

(75) Inventors: Sei Tsunoda, Tokyo (JP); Hideharu Nobutoki, Tokyo (JP); Noboru Mikami, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/294,412

(22) Filed: Dec. 6, 2005

(65) Prior Publication Data

US 2006/0091382 A1    May 4, 2006

Related U.S. Application Data

(62) Division of application No. 09/942,626, filed on Aug. 31, 2001, now Pat. No. 7,029,605.

(51) Int. Cl.
H01B 1/02 (2006.01)
H01B 1/06 (2006.01)
C08G 79/08 (2006.01)
C01B 35/00 (2006.01)

(52) U.S. Cl. ............... 252/521.4; 252/521.5; 528/394; 528/7; 423/276

(58) Field of Classification Search ............ 257/40
See application file for complete search history.

(56) References Cited

U.S. PATENT DOCUMENTS 3,288,726 A * 11/1966 Wagner .................. 528/7
5,188,757 A    2/1993 Paine et al.
5,855,962 A    1/1999 Cote et al.
6,458,719 B1  10/2002 Tsunoda et al.

FOREIGN PATENT DOCUMENTS

JP    7-196372    8/1995
JP    10-209146    8/1998

OTHER PUBLICATIONS

Wideman et al., "Second-Generation Polymeric Precursors for BN and SiNCB Ceramic Materials," Appl. Organometal. Chem. 12, 681-693 (1998).*
U.S. Appl. No. 11/294,412, filed Dec. 6, 2005, Tsunoda et al.
H. Shibata, "Low-κ Interlayer Dielectric Technology for High Performance LSIs", Technical Survey, Densijyouhoutsuusin Gakkaishi, vol. 80, No. 3, pp. 235-239 (Mar. 1997).
Y. Kimura, "BN Fiber as a Main Topic of Inorganic Fibers", Department of Polymer Science and Engineering, Kyoto Institute of Technology, Sennitokogyou, vol. 52, No. 8, pp. 341-345 (1996).
R.T. Paine, et al., "Recent Developments in Borazine-Based Polymers", American Chemical Society, Chapter 27, pp. 358-374 (1994).
P.J. Fazen, et al., "Synthesis and Ceramic Conversion Reactions of Polyborazylene", Polymer Preprints, vol. 32, pp. 544-545 (1991).
C.K. Narula, et al., "Synthesis of Boron Nitride Ceramics from Poly (Borazinylamine) Precursors", J. Am. Chem. Soc., vol. 109, pp. 5556-5557 (1987).
A.T. Lynch, et al., "Transition-Metal-Promoted Reactions of Boron Hydrides, 12.'Syntheses, Polymerizations, and Ceramic Conversion Reactions of B-Alkenylborazines", J. Am. Chem. Soc., vol. 111, pp. 6201-6209 (1989).
Paine, et al., "Synthetic Routes of Boron Nitride", Chem. Rev., vol. 90, pp. 73-91 (1990).
Electronic Engineering Times (2004).
AIST Today International Edition No. 5 (2002).

* cited by examiner

Primary Examiner—Mark Kopec
Assistant Examiner—Jaison Thomas
(74) Attorney, Agent, or Firm—Oblon, Spivak, McClelland, Maier & Neustadt, P.C.

(57) ABSTRACT

There is provided a low dielectric constant material, which is excellent in thermal resistance, has low dielectric constant, and is applicable to a semiconductor device or electric appliances, an insulation film between semiconductor layers using the same, and the semiconductor device. The material is the low dielectric constant material having thermal resistance, which contains borazine skeletal molecules shown by the following formula (1) and the like in an inorganic or organic material molecule.

8 Claims, No Drawings

LOW DIELECTRIC CONSTANT MATERIAL HAVING THERMAL RESISTANCE, INSULATION FILM BETWEEN SEMICONDUCTOR LAYERS USING THE SAME, AND SEMICONDUCTOR DEVICE

BACKGROUND OF THE INVENTION

The present invention relates to the low dielectric constant material having thermal resistance, an insulation film between semiconductor layers using the same, and the semiconductor device.

Along with improvement in speed and high integration of a semiconductor device, the problem of signal retardation has become serious. The signal retardation is expressed with the product of resistance R of a wire and capacity C between wires and between layers. In order to suppress the retardation to the minimum, it is an effective means to lower the dielectric constant of an insulation film between layers, as well as to lower resistance of wiring.

Recently, in order to lower the dielectric constant of an insulation film between layers, there is proposed a method for forming an insulation film between layers using a silicon oxide film (SiOF film) wherein the fluorine atom is incorporated. Moreover, since an organic compound material can relatively lower dielectric constant, there is proposed a method for forming an insulation film between layers by using a parylene deposit film or a polyimide film wherein a fluorine atom is incorporated (Hideki Shibata, Densijyouhoutsuusin Gakkaishi Vol. 80, No. 3 p235(1997)).

By the way, the dielectric constant of the insulation film between layers becomes lower than that of the conventional film, when the insulation film between layers is formed by the above SiOF film. However, a dielectric constant thereof becomes about 3.2 to 3.5, capacity between wires can not be reduced and signal propagation delay of wires can not be sufficiently prevented.

Moreover, the dielectric constant 2.7 is attained by using the film wherein the fluorine atom is incorporated into the polyimide and aryl ether polymer, when an insulation film between layers is formed with the organic compound material mentioned below. But it is not still sufficient. By using deposit film of parylene a dielectric constant 2.4 can be attained, but the process for preparing a semiconductor device is limited, since thermal resistance is only about 200 to 300° C.

The dielectric constant of 2.0 to 2.5 has been reported in porous $SiO_2$ film. But there is a problem that mechanical strength (CMP polishing process resistance) is low due to high porosity, and a pore diameter varies.

Since thermal conductivity of these polymeric materials and porous $SiO_2$ film is lower than that of the conventional insulation film between layers of $SiO_2$, there is a problem that the wiring life is degraded (electromigration) by the wire temperature rise.

As mentioned above, the insulation film between layers has been desired, which has low dielectric constant and is excellent in thermal resistance, mechanical strength, and the thermal conductivity.

Concretely, in design-rule 0.13 to 0.10 μm, the film is required, which has mechanical strength and thermal conductivity not less than an $SiO_2$ film, dielectric constant of at most 2.4, and thermal resistance (thermal decomposition temperature) of at least 450° C.

SUMMARY OF THE INVENTION

The object of the present invention is to provide the low dielectric constant material, which is excellent in thermal resistance, has low dielectric constant and can be applied to appliances of semiconductor device and electric circuit, an insulation film between semiconductor layers using the same, and the semiconductor device.

The low dielectric constant material having thermal resistance of the present invention contains borazine skeletal molecules shown by the following formula (1), (2), or (3) in an inorganic or organic material molecule.

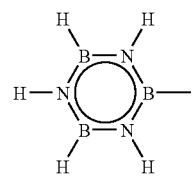

(1)

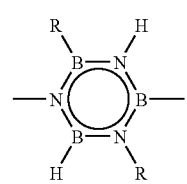

R = H or borazinyl (2)

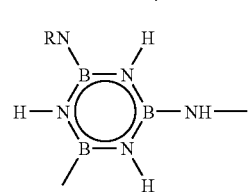

R = $H_2$, (borazinyl)$_2$, or H+borazinyl (3)

The semiconductor insulation film between layers of the present invention comprises the low dielectric constant material having thermal resistance.

The semiconductor device of the present invention contains the semiconductor insulation film between layers comprising the low dielectric constant material having thermal resistance.

DETAILED DESCRIPTION

The material containing borazine skeletal molecules in an inorganic or organic material molecule of the present invention is synthesized according to condensation reaction by using borazine as a starting material, which has a basic unit of borazin shown by the following formula (4) (which is called as inorganic benzene or borazol). The synthesized material can be applied to a semiconductor insulation film between layers by forming a thin film, and an excellent semiconductor device can be produced by using the semiconductor insulation film between layers.

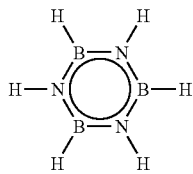

(4)

The present invention can improve thermal resistance, since the inorganic polymer material is used, which is excellent in thermal resistance compared with the organic polymer material.

The reasons why the material of the present invention can lower the dielectric constant are follows.

That is, the dielectric constant $\epsilon$ is generally described with sum of polarization such as electron polarization, atom polarization, orientation polarization, and interface polarization. But it is sufficient to consider only the electron polarization and the atom polarization as polarization controlling dielectric constant, as long as there is no contribution of interfacial polarization in the high frequency region of at least 1 MHz in the present invention, and there is used the material showing no orientation. The present invention is completed by results of molecular design for searching the material with the small polarizability of both electron polarization and atomic polarization.

If molecular polarizability $\alpha$ is defined as $$\alpha = \alpha(\text{electron polarization}) + \alpha(\text{atom polarization})$$

dipole-moment $\mu$ of a molecule is given as a function of an electric field E and basic coordinate q of a molecule. The electron polarization and the atom polarization can be evaluated by differentiating the dipole moment $\mu$ with the electric field E.

$$d\mu(E, q)/dE = \delta\mu(E, q)/\delta E + \delta\mu(E, q)/\delta q \delta\mu/\delta E$$

$$\alpha(\text{electron polarization}) = \delta\mu(E, q)/\delta E$$

$$\alpha(\text{atom polarization}) = \delta\mu(E, q)/\delta q \delta\mu/\delta E$$

$$= \delta\mu/\delta q (\delta^2 E/\delta q \delta q)^{-1} \delta\mu/\delta q$$

$$= \delta\mu/\delta q (\kappa)^{-1} \delta\mu/\delta q$$

As shown above, the atom polarization is in inverse proportion to bonding strength $\kappa$ (force constant) between atoms.

Next, concrete calculation method of the polarizability $\alpha$ is explained as follows. Dielectric constant $\epsilon$ of fluorinated parylene is 2.4 as mentioned above, and molecular orbital calculation was carried out in the model compounds shown in the following formula (5) to (10). Table 1 collectively shows the results of calculation.

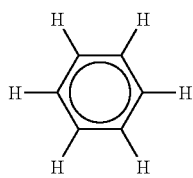

(5)

-continued

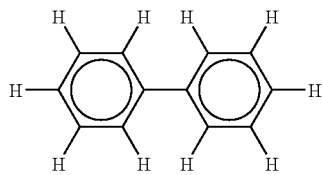

(6)

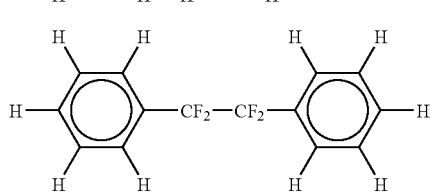

(7)

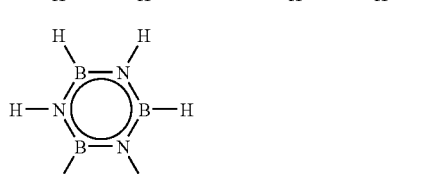

(8)

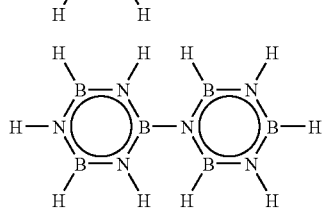

(9)

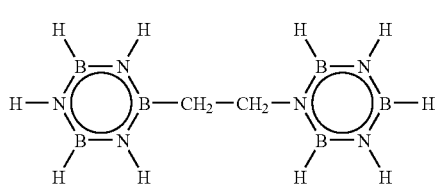

(10)

TABLE 1

| | formula 2 | formula 3 | formula 4 | formula 5 | formula 6 | formula 7 |
|---|---|---|---|---|---|---|
| $\alpha$ (election polarization) | 48 | 103 | 120 | 39 | 87 | 101 |
| $\alpha$ (atom polarization) | 0.11 | 0.21 | 1.35 | 1.81 | 3.92 | 3.76 |
| (molecular polarizability) $\alpha$ | 48.11 | 103.21 | 121.35 | 40.81 | 90.92 | 104.76 |

As is clear from Table 1, it is found out that molecular polarizability $\alpha$ in the borazine system (formula (8), (9) and (10)) is smaller than that in the hydrocarbon system (formula (5), (6) and (7)). Namely, the borazine system theoretically shows a small dielectric constant. The molecular polarizability ratios of each system are as follows, respectively.

Formula (8)/Formula (5)=0.85

Formula (9)/Formula (6)=0.88

Formula (10)/Formula (7)=0.86

It shows that it is predicted that dielectric constant $\epsilon$ of the borazine system (formula (10)) is 2.0 to 2.1, since the dielectric constant $\epsilon$ of fluorinated parylene (formula (7)) is 2.4.

From the calculation results, examples of the material containing borazine skeleton molecule in its molecule, which is especially applicable to the present invention, are the inorganic or organic material containing the molecule shown in the formula (11) to (17) in their molecules. Examples of the inorganic material are silicates, silazanes, silsequioxanes, siloxanes, silanes and the like. Examples of the organic material are poly(aryl ether), parylene, polyphenylene, polyphenylenevinylene, polybenzocyclobutene, and the like.

(11)
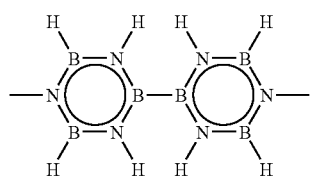

(12)
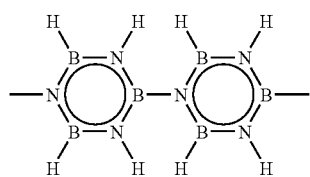

(13)
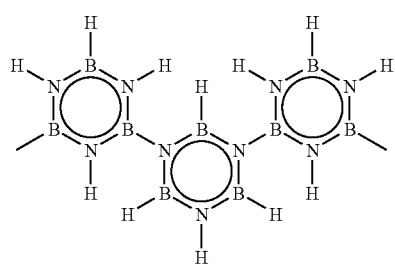

(14)
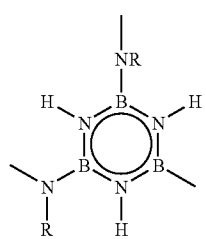

R = H or borazinyl

-continued

(15)
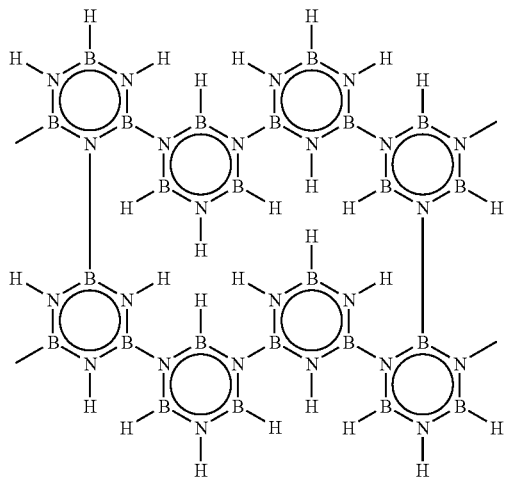

(16)
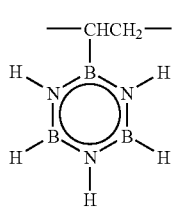

(17)
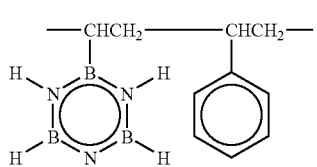

The low dielectric constant materials of the present invention can be prepared by the method described in, for example, "Yoshiharu Kimura, Sennitokogyou, Vol. 52, No. 8, p341(1996)", "Paine & Sneddon, Recent Developments in Borazine—Based Polymers, "Inorganic and Organometallic Polymers", p359, American Chemical Society, (1984)", and the like. That is, the materials can be obtained by condensation reaction of borazine as the starting material due to heating, or by synthesizing a prepolymer and then polymerizing it, or the like.

In the above synthesis, there may be used a solvent, which can homogeniously disperse or dissolve a borazine raw material and a borazine prepolymer. Examples thereof are various alcoholes such as methanol, ethanol, propanol and butanol; acetone, benzene, toluene, xylene, and the like.

In addition, the polymer is excellent in thermal stability, although it is necessary to handle borazine carefully since borazine may be ignited spontaneously in air.

When it is used as an LSI insulation film between layers, the low dielectric constant material can be applied to the substrate by spray coating method, dip coating method, the spin coat method, and the like. The low dielectric constant material is previously dissolve or disperse into the solvent such as acetone, benzene, glyme, tetrahydrofuran, or chloroform. The concentration is preferably 10 to 30% by weight. Subsequently, the insulation film is obtained by drying and heating. The thickness of the film is preferably 0.3 to 0.8 μm.

When the material is used as a bulk of a low dielectric constant substrate, it is put into a mold and heat to form the article. The insulation film of the present invention can be applied to various electric appliances such as an insulation film between layers for LSI device and IC substrate.

Next, the low dielectric constant material of the present invention is concretely explained by using examples.

EXAMPLE 1

Soluble borazin was synthesized according to the method of Fazen et al, (Faren et al., Polymer Preprints, Vol. 32, p544, 1991).

That is, 5,000 mg of borazine was heated in Ar air with stirring and depressurizing at 70° C. for 12, 24, 36, 48, 60, and 72 hours, respectively to obtain each liquid having low to high viscosity. The liquid was evaporated to obtain white powder A to F in amounts of 3,500 mg, 4,200 mg, 4,500 mg, 4,700 mg, 4,730 mg, and 4,750 mg, respectively. Chemical structure of the samples A to F are shown in the following formula (18).

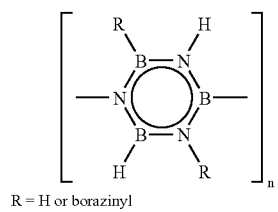

(18)

R = H or borazinyl

For example, average molecular weight (Mn) of the sample B is about 1,000, and molecular formula thereof is $B_3N_3H_4$ (n=13, R=H, end group=H or borazinyl). Average molecular weight (Mn) of the sample F is about 3,500, and molecular formula thereof is $B_3N_3H_3$ (n=46, R=H or borazinyl, end group=H or borazinyl).

Samples A to F were dissolved and dispersed into acetone in concentration of 25% by weight, and by the spin coat method the solutions were applied onto the quartz plate wherein gold was deposited as a counterelectrode. Then, the applied film was dried at 70° C. for 10 minutes (applied films A to F, respectively) and heated at 400° C. for 10 minutes (applied films G to L, respectively). Gold was deposited onto these as a main electrode. Applied films G to L have molecular formula ~$B_3N_3H_2$, are partially crosslinked, and have thickness of 0.4, 0.8, 1.1, 1.3, 1.8, and 2.0 μm, respectively.

EXAMPLE 2

There was used 2,000 mg of white powder of poly(aminoborazinyl), which was prepared by the method of Narula et al. (C. K. Narula, R. Schaeffer, R. T. Paine, A. K. Datye, W. F. Hammetter, J. Am. Chem. Soc., Vol. 109, p5556, and 1987). It was dispersed into acetone, and the dispersing solution having concentration of 20% by weight was applied by the spin coat method in the same manner as Example 1. After applied film was dried at 70° C. for 10 minutes (applied film M), gold was deposited thereon as a main electrode. The applied film M has molecular formula ~$B_3N_3H_2$, are partially crosslinked, and have thickness of 0.5 μm.

EXAMPLE 3

Into benzene was dissolved 2,000 mg of B-vinylborazine which was prepared by the method of Lynch (A. T. Lynch, L. G. Sneddon, J. Am. Chem. Soc., Vol. 111, p6201, 1989). In the presence of 1.6 mol % of (azobisisobutyronitorile) (AIBN), the solution was heated at 70° C. for 20 hours to obtain a benzene solution (concentration of 10% by weight) of poly(B-vinylborazine) (average molecular weight (Mn) of about 10,000). It was applied by the spin coat method in the same manner as Example 1. After applied film was dried at 70° C. for 10 minutes (applied film N), gold was deposited thereon as a main electrode. The applied film N has molecular formula ~$B_3N_3H_2$, are partially crosslinked, and have thickness of 1.5 μm.

EXAMPLE 4

Into benzene were dissolved 3 mole of B-vinylborazine used in Example 3 and 1 mole of styrene to obtain a benzene solution (concentration of 10% by weight) of poly(styrene-co-B-vinylborazine) (average molecular weight of about 50,000). It was applied by the spin coat method in the same manner as Example 1. After applied film was dried at 70° C. for 10 minutes (applied film O), gold was deposited thereon as a main electrode. The applied film O has molecular formula ~$B_3N_3H_2$, are partially crosslinked, and have thickness of 1.8 μm.

Dielectric constants of the applied films A to O were measured at 25° C. and 1 MHz by using an impedance analyzer (4191A made by Hewlett Packard). Results of measurement are collectively shown in Table 2.

TABLE 2

| Coating film | Dielectric constant (1 MHz) |
| --- | --- |
| A | 2.15 |
| B | 2.16 |
| C | 2.05 |
| D | 1.98 |
| E | 2.23 |
| F | 2.25 |
| G | 2.36 |
| H | 2.28 |
| I | 2.30 |
| J | 2.29 |
| K | 2.28 |
| L | 2.35 |
| M | 2.38 |
| N | 2.01 |
| O | 2.11 |

The applied films A to O obtained in Examples 1 to 4 have dielectric constant of at most 2.4. These results show that the substrate having low dielectric constant can be obtained.

Also, these substrates have thermal resistance of at least 450° C. since it is known that these borazine polymer compounds are graphitized by heating at 1,000 to 1,200° C. (Supervised by Naruyuki Kajiwara, "Application View of Inorganic Polymer", p70, 1990).

According to the low dielectric constant material of the present invention, there can be provided the low dielectric constant material having thermal resistance, which has specific dielectric constant of at most 2.4 and thermal resistance of at least 450° C.

According to the semiconductor insulation film between layers and the semiconductor device of the present invention, there can be provided the semiconductor insulation film between layers, which has specific dielectric constant of at most 2.4 and thermal resistance of at least 450° C. Since electronic signal retardation becomes small by applying the insulation film to a semiconductor device such as a IC substrate, or electric appliances, high speed of the device can be achieved.

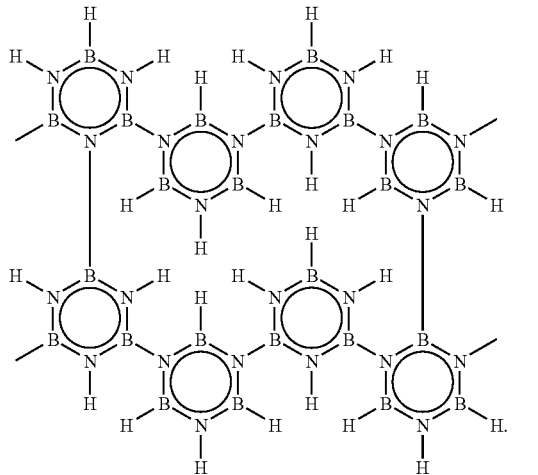

(15)

What is claimed is:

1. A low dielectric constant material having thermal resistance, comprising borazine moieties having the following formula [15] as part of an inorganic or organic material molecule, wherein said material has a dielectric constant of at most 2.4 and a thermal resistance of at least 450° C.:

2. The material of claim 1, wherein the inorganic material is selected from the group consisting of silicates, silazanes, silsequioxanes, siloxanes, and silanes, and the organic material is selected from the group consisting of poly(aryl ether), parylene, polyphenylene, polyphenylenevinylene, and polybenzocyclobutene.

3. The material of claim 2, wherein the molecule is an inorganic material molecule.

4. The material of claim 2, wherein the molecule is an organic material molecule.

5. A film obtained from the material of claim 1.
6. A film obtained from the material of claim 2.
7. A film obtained from the material of claim 3.
8. A film obtained from the material of claim 4.

* * * * *